United States Patent [19]
Tani et al.

[11] Patent Number: 6,045,975
[45] Date of Patent: *Apr. 4, 2000

[54] PHOTOSENSITIVE, HEAT-RESISTANT RESIN COMPOSITION FOR FORMING PATTERNS

[75] Inventors: Motoaki Tani; Eiji Horikoshi; Isao Watanabe; Shoichi Miyahara; Takashi Ito; Makoto Sasaki, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/064,664

[22] Filed: May 21, 1993

Related U.S. Application Data

[63] Continuation-in-part of application No. 07/684,271, Apr. 12, 1991, abandoned.

[30] Foreign Application Priority Data

| Apr. 16, 1990 | [JP] | Japan | 2-099788 |
| Oct. 19, 1990 | [JP] | Japan | 2-279088 |
| May 22, 1992 | [JP] | Japan | 4-130837 |

[51] Int. Cl.[7] .................................... G03C 1/73
[52] U.S. Cl. ................... 430/285.1; 430/287.1; 430/288.1; 430/906; 430/920; 430/925
[58] Field of Search ............... 430/288, 287, 430/286, 285, 283, 283.1, 285.1, 286.1, 287.1, 288.1, 281.1

[56] References Cited

U.S. PATENT DOCUMENTS

| 3,615,454 | 10/1971 | Cescon et al. | 430/281.1 X |
| 4,048,035 | 9/1977 | Ide et al. | 430/285.1 X |
| 4,243,743 | 1/1981 | Hiramoto et al. | 430/281.1 |
| 4,389,504 | 6/1983 | St. Clair | 524/233 |
| 4,395,518 | 7/1983 | Giles, Jr. et al. | 528/180 |
| 4,416,973 | 11/1983 | Goff | 430/280.1 |
| 4,430,418 | 2/1984 | Goff | 430/288.1 |
| 4,454,220 | 6/1984 | Goff | 430/283.1 X |
| 4,537,855 | 8/1985 | Ide | 430/287.1 X |
| 4,565,767 | 1/1986 | Kataoka et al. | 430/283.1 X |
| 4,579,809 | 4/1986 | Irving | 430/283.1 |
| 4,962,011 | 10/1990 | Aldag et al. | 430/281.1 |
| 4,987,188 | 1/1991 | Furno et al. | 525/180 |
| 5,438,105 | 8/1995 | Nagata | 525/436 |

FOREIGN PATENT DOCUMENTS

| 2914619 | 10/1979 | Germany | G03C 1/71 |
| 63-175854 | 7/1988 | Japan | G03C 1/68 |
| 1-105241 | 4/1989 | Japan | G03C 1/68 |
| 4-88021 | 3/1992 | Japan | G08G 73/10 |

OTHER PUBLICATIONS

*Patent Abstracts of Japan*, vol. 12, No. 453 (P–792) (3300), Nov. 29, 1988 (JP 63–175854).

(List continued on next page.)

*Primary Examiner*—Bernard Codd
*Attorney, Agent, or Firm*—Staas & Halsey

[57] ABSTRACT

The film forming, photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer. The resin composition is useful for the production of circuit substrates and semiconductor devices for high-density mounting including multi-chip modules or the like, such as printed circuits, printed boards, wiring boards and electronic components, since it can effectively avoid a reduction of the layer thickness during the film formation, and ensures a low cost production process. The pattern formation process using the such resin composition is also disclosed.

2 Claims, 4 Drawing Sheets

OTHER PUBLICATIONS

*World Patents Index,* An 80–10213C, Week 8006, Dec. 24, 1979 (JP 54–162798), Derwent Publications Ltd., London, GB.

Yoda and Hiramoto, New Photosensitive High Temperature Polymers for Electronic Applications, J. Macromol. SCL–CHEM., A21 (13 & 14), pp. 1641–1663 (1984).

Photopolymer Handbook, Jun. 26, 1989, pp. 270–279, Kogyo Chosakai Publishing Co., Ltd.

U.S. application No. 08/772,260, Tani et al., filed Dec. 23, 1996 Fujitsu Limited.

U.S. application No. 08/418,169, Tani et al., Apr. 6, 1995 Fujitsu Limited.

Tani et al, "Photosensitive Dielectric Film Developed Using a Polymer Blend" Mat. Res. Soc. Symp Proc. vol. 264 p. 37–42, 1992.

Horikoshi et al, "Thin–Film Circuit Board Using a Polymer Blend Dielectric," ICEMM Proceedings '93 p. 266–270, 1993.

Hawley's Condensed Chemical Dictionary, 10th Ed. p. 699, 1977.

PHOTOSENSITIVE, HEAT-RESISTANT RESIN COMPOSITION FOR FORMING PATTERNS

This application is a continuation-in-part of U.S. patent application Ser. No. 07/684,271, filed on Apr. 12, 1991, now abandoned.

BACKGROUND OF THE INVENTION

1. Field of the Invention

The present invention relates to a film forming, photosensitive, heat-resistant resin composition and a process for the formation of a heat-resistant insulating resin pattern using such composition. The film formed from the photosensitive, heat-resistant resin composition (in the present specification, the term "film" is used in a broad sense to indicate various coatings, films, thin films, etc.) adheres excellently to base materials and has good heat resistance, moisture resistance, insulating properties, toughness, abrasion resistance, and weather resistance, and further, can be formed at a low cost. Further, the process for formation of a pattern according to the present invention is advantageous in that the use of a photoresist for masking is not necessary, and a pattern of heat-resistant insulating resin film formed by this process is useful as one of the components of a circuit board or a semiconductor device, and can be utilized, for example, as a protective film or an insulating film (layer insulating film) in printed circuits, printed boards, wiring boards, and electronic components for high-density mounting. The term "base material" or "base material to be treated" as used in the present specification refers to mean general-use substrates including semiconductor substrates, ceramic substrates, metallic substrates, and various layered films and wiring.

2. Description of the Related Art

Solder jointing is utilized for mounting IC chips in printed circuits, printed boards, wiring boards and electronic components including multi-chip modules or the like (as exemplified in FIGS. 1 and 2) for high-density mounting, and accordingly, the insulating films used for the above-described circuit substrates should be able to withstand the heat applied during the soldering. Further, since a large amount of information must be rapidly processed, reductions in the size and increases in the capacity of information processors are required. Semiconductor devices constituting a major part of such processors have been integrated through a reduction in the size of unit elements, thus enabling LSIs and VLSIs to be put to practical use. The quantity of heat (heat value) emitted from a semiconductor device increases with an increase in the integration of unit elements, and in an LSI, the heat value amounts to about 10 W.

Integration is achieved by a multi-layerization of the circuit, and when forming a semiconductor integrated circuit element, insulators are needed for layer insulation and surface protection, and inorganic insulators, such as phosphosilicate glass (abbreviated to "PSG"), silicon dioxide ($SiO_2$) and silicon nitride ($Si_3N_4$), are used for this purpose.

Although the above-described inorganic insulators have excellent properties such as dielectric strength and heat resistance, it is difficult to form an insulating film having a large thickness therefrom because inorganic insulating films are formed by a chemical vapor deposition process (abbreviated to "CVD").

The surfaces of semiconductor substrates to be coated with an insulating film have a significant number of fine uneven portions having a large aspect ratio, and inorganic insulating films take on a form which is similar to the form of the surface of the substrate, and this raises the problems of impossibility of smoothing the substrate surface and insufficient coverage.

Accordingly, investigations have been made into the use of polyimide, which can be coated by spin coating and has excellent heat resistance, not only as a surface protective film of a semiconductor integrated circuit element but also as a layer insulating film. A polyimide film for use as a surface protective film or a layer insulating film can be formed by dissolving a polyimide precursor, such as bismaleimide, polyamide acid or diamine, in a solvent, such as N-methyl-2-pyrrolidone (abbreviated to "NMP"), coating the resulting solution on a semiconductor substrate by a method such as spin coating, and heating the coating to a temperature of 150 to 400° C. to cause a cyclodehydration reaction to occur, and thus cause the coating to be cured. The cyclodehydration reaction is also referred to as a polyimidalization reaction. Since the polyimide used herein has no photosensitivity in itself, a fine polyimide pattern may be formed by coating a photoresist on a polyimide precursor film, forming a resist pattern by photolithography, transferring the resist pattern to the lower layer by wet etching or plasma etching to form a pattern comprising a polyimide precursor, and heat-treating the pattern to cause a cyclodehydration reaction to occur, to thereby form a polyimide pattern.

A polyimide having photosensitivity in itself, which enables a polyimide to be patterned to any form, has been developed and is commercially available from various manufacturers. In this photosensitive polyimide, a photosensitive functional group is incorporated in the molecule of a polyimide precursor, and photoreaction occurs only in an exposed portion for polymerization, thereby varying the solubility between the unexposed portion and the exposed portion, and development is then conducted by making use of a solvent to dissolve and remove the unexposed portion while leaving only the exposed portion.

In subsequent heat treatment, the photosensitive groups have a poor heat resistance and are thermally decomposed and removed with the advance of cyclodehydration, so that only the polyimide portions having good heat resistance remain. The photosensitive groups can be introduced into the polyimide precursor through a covalent bond, an ionic bond or the like, and various photosensitive polyimides are commercially available.

The use of the above-described photosensitive polyimides, however, have the problem of high cost of the photosensitive polyimide per se, in addition to a large reduction in the film thickness which occurs as a result of the decomposition of a photosensitive group. Further, both non-photosensitive polyimides and photosensitive polyimides have the problem of poor moisture resistance.

For reference, the following patents may be mentioned as examples of patents describing processes for the formation of a pattern.

Japanese Unexamined Patent Publication (Kokai) No. 56-22428 discloses a process for the formation of a polyimide pattern, characterized by comprising the steps of (1) forming a film of a photosensitive polyimide precursor on a substrate; (2) irradiating the film with light in a pattern form and conducting development of the pattern; (3) heating the developed polyimide precursor pattern to convert the pattern to a polyimide pattern; and (4) treating the resultant polyimide pattern with an etchant for polyimide. A polyimide precursor bonded to a photosensitive group through a chemical bond or mixed with a photosensitive compound (such as bichromate) is used as the photosensitive polyimide precursor. In this process, the development residue of unexposed portions can be easily removed, so that through-holes free from defects can be obtained.

Japanese Unexamined Patent Publication (Kokai) No. 59-107346 discloses a heat-resistant photosensitive material comprising a photosensitive polyimide precursor including structural units represented by the following formula:

wherein $R_1$ and $R_2$ are each an aromatic ring group, $R_3$ is a thietane ring, and $COOR_3$ is bonded to the amide group at its ortho-position. An insulating, heat-resistant polyimide pattern having good adhesion to the semiconductor substrate can be prepared through the use of such photosensitive material in the formation of a pattern.

In addition to these Japanese Kokais, although it is not considered to be relevant to the present invention, Japanese Unexamined Patent Publication (Kokai) No. 54-109828 discloses a heat-resistant photoresist composition which comprises 100 parts by weight of at least one polymer selected from a variety of organic polar solvent-soluble, heat-resistant polymers including polyimide, and 0.1 to 100 parts by weight, preferably 1 to 50 parts by weight of a monomeric compound containing at least two ethylenically unsaturated double bonds in its molecule. The amount of the monomeric compound incorporated into the heat-resistant polymer should not exceed 100 parts by weight, because larger amounts cause a reduction of the heat resistance of the resulting photoresist. This is because the specified monomeric compounds do not exhibit excellent heat resistance after curing of the resist.

The use of photosensitive polyimides as layer-insulating films in the production of integrated circuits wherein a considerable amount of heat is generated during use is desired in the art. As described above, photosensitive polyimides, however, have the problem of lowering the precision of the pattern due to the reduction in the film thickness resulting from the decomposition of the photosensitive groups during heat-treating of the photosensitive polyimide precursor to convert it into a polyimide, and further, photosensitive polyimides have the problem of the high cost of the material per se.

SUMMARY OF THE INVENTION

Accordingly, an object of the present invention is to provide a film forming, photosensitive, heat-resistant resin composition which is useful in the production of circuit substrates and semiconductor devices for high-density mounting including multi-chip modules or the like, such as printed circuits, printed boards, wiring boards and electronic components, which causes no reduction in film thickness during the formation of a film therefrom, and which is low in cost.

Another object of the present invention is to provide an improved process for the formation of a heat-resistant insulating resin pattern through the use of the photosensitive, heat-resistant resin composition of the present invention, without the aid of a photoresist.

Still another object of the present invention is to provide a circuit board produced by using the above pattern formation process.

It is also an object of the invention to provide a film of a heat-resistant resin which is obtained from the resin composition of the present invention.

To attain these objects, the present inventors have conducted intensive and extensive studies, and as a result, it has been found that the use of a polyimide precursor having no photosensitivity in itself in combination with a particular polymerizable monomer or oligomer can eliminate the problems of conventional photosensitive polyimides, and further, enables the formation of polyimide films for use as surface protective films or layer-insulating films at a much lower cost than that of the conventional processes.

According to one aspect of the present invention, there is provided a film forming, photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer. The composition is designed for use in a polymerization process in which said monomer or oligomer is polymerized and simultaneously or subsequently the composition is heated to cause a cyclodehydration reaction to occur and cure (i.e. polymerize) said polyimide precursor.

In a particularly preferred embodiment, the composition of the present invention contains an acrylic monomer or oligomer compatible with said varnish and capable of providing a high-heat-resistant polymer upon being polymerized, as the polymerizable monomer, and a dimeric imidazole compound, as the polymerization initiator. The inventors have found that the resin composition preferentially containing a certain dimeric imidazole polymerization initiator provides an excellent polymerized film showing a reduced surface roughness and having a large thickness and high heat-resistance.

According to another aspect of the present invention, there is provided a process for the formation of a pattern, which comprises the steps of: coating a base material to be treated with a photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for the monomer or oligomer; exposing the resultant coating of the photosensitive, heat-resistant resin composition to conditions capable of inducing polymerization of the polymerizable monomer or oligomer in a predetermined pattern, thereby selectively polymerizing the monomer or oligomer at preselected regions; selectively removing the coating from the base material at regions other than said preselected regions where a polymer of the monomer or oligomer has been formed; and heat-treating the residual coating to cause a cyclodehydration reaction to occur and cure the polyimide precursor contained in the coating.

According to another aspect of the present invention, there is provided a circuit board which comprises a substrate, at least two electrically conductive layers applied over the substrate, a layer-insulating film for insulating the electrically conductive layers from each other, and said layer-insulating film having a viahole therethrough, an interlayer conductor occupying said viahole in the layer-insulating film for electrically interconnecting the electrically conductive layers, said viahole-containing layer-insulating film having been prepared by the steps of:

coating one of said electrically conductive layers with a photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer;

exposing the resultant coating of the photosensitive, heat-resistant resin composition to conditions capable of inducing polymerization of said polymerizable monomer or oligomer in a predetermined pattern, thereby selectively polymerizing said monomer or oligomer at preselected regions;

selectively removing said coating from said one electrically conductive layer at regions other than said preselected regions where a polymer of said monomer or oligomer has been formed; and heat-treating the residual coating to cause a cyclodehydration reaction to occur and cure said polyimide precursor contained in the coating. The substrate used herein is preferably a member selected from the group consisting of semiconductor substrates, ceramic substrates, metallic substrates, inorganic substrates and organic substrates.

According to a further aspect of the present invention, there is provided a film of a heat-resistant resin of polymer blend, the polymer blend being made up of a polymer resulting from a polyimide precursor and a polymer resulting from the polymerization of a monomer or oligomer in the presence of a polymerization initiator, and the film being formed by:

coating a base material with a photosensitive, heat-resistant resin composition comprising a varnish of a polyimide precursor having no photosensitivity in itself, a polymerizable monomer or oligomer compatible with said varnish and capable of providing a high-heat-resistant polymer upon being polymerized, and a polymerization initiator for said monomer or oligomer;

exposing the resultant coating of the photosensitive, heat-resistant resin composition to conditions capable of inducing polymerization of said polymerizable monomer or oligomer, thereby selectively polymerizing said monomer or oligomer at preselected regions;

selectively removing said coating from said base material at regions other than said preselected regions where a polymer of said monomer or oligomer has been formed; and heat-treating the residual coating to cause a cyclodehydration reaction to occur and cure said polyimide precursor contained in the coating.

DESCRIPTION OF THE PREFERRED EMBODIMENTS

In the present invention, a film forming, photosensitive, heat-resistant resin composition is prepared through a combination of a polyimide precursor having no photosensitivity in itself with, for example, an acrylic or methacrylic monomer or oligomer, a phosphazenic monomer or oligomer, or some other polymerizable monomer or oligomer and a polymerization initiator. The functions of the present invention will now be described by way of an embodiment, wherein the polymerizable monomer or oligomer is photopolymerizable.

As described above, the present inventors have studied processes whereby the problems of photosensitive polyimides can be eliminated, and further, whereby polyimide films for layer-insulating layers may be formed at much lower costs than conventional processes. As a result it has been found that, when a base material to be treated is coated with a mixture of a photopolymerizable monomer or oligomer having excellent heat resistance properties and a varnish of a polyimide precursor, subjected to selective exposure through the use of a mask or the like and then developed, the varnish of the polyimide precursor at non-exposed portions may be dissolved and removed together with the monomer or oligomer therein while the varnish of the polyimide precursor at exposed portions remains as it is together with a polymer derived from the monomer or oligomer.

When the varnish of the polyimide precursor and the polymer derived from the monomer or oligomer remaining at the exposed portions is then heat-treated, a cyclodehydration reaction involving the polyimide precursor proceeds, thus causing the polyimide precursor to be converted into a polyimide. Nevertheless, since the polyimide resin pattern thus formed is a mixture or copolymer of a polyimide with the polymer of the monomer or oligomer, the heat resistance is inferior to that of a pattern consisting of a polyimide only. It should be noted that the fact that the polyimide resin pattern is a mixture or copolymer of a polyimide with the polymer is not yet completely clarified, but it will be described hereinafter with reference to FIGS. 4A to 4C. In this case, the use of a photopolymerizable monomer having excellent heat resistance properties as the photopolymerizable monomer or oligomer enables the electrical properties required in electronic components, such as heat resistance and insulating properties, to be sufficiently maintained.

Specifically, in JIS (Japanese Industrial Standard) standards, the heat resistance during soldering at 270° C. is specified as the heat resistance of electronic components, and the photosensitive, heat-resistant resin derived from the photosensitive, heat-resistant resin composition can sufficiently maintain the heat resistance specified in the JIS standards.

As a result of experiments, the present inventors have found that the properties of the photosensitive, heat-resistant resin depend upon the properties of the photopolymerizable monomer or oligomer and photopolymerization initiator, rather than the varnish of the polyimide precursor.

In the practice of the present invention, a precursor of any one of a variety of polyimides (including modified polymers) can be used. According to the findings of the present inventors, the polyimide precursor may be prepared according to need or a commercial availability, and no significant difference is observed in the effect of these polyimides. Suitable polyimide precursors may be a member selected from the group consisting of precursors of polyimides, precursors of modified polyimides, precursors of polybismaleimides and precursors of modified polybismaleimides. Similarly, polyimide engineering plastics also may be used. The above-described precursors may be used alone or in the form of a mixture thereof.

The polymerizable monomer or oligomer compatible with the varnish and capable of providing a high-heat-resistant polymer upon being polymerized is preferably an acrylic or methacrylic monomer or oligomer, and examples thereof include compounds having at least two functionalities (in other words, at least two reactive groups having an unsaturated bond) in their molecules, compounds having an isocyanurate structure, compounds having an acryloyl or methacryloyl group in a terminal and/or a side chain in theirs molecules, oligoester acrylates and phosphazenic monomers or oligomers. The above-described polymerizable monomers or oligomers can usually be polymerized through the action of light, heat and the like, and photopolymerizable or heat polymerizable monomers or oligomers are preferred.

The present inventors have studied photopolymerizable monomers or oligomers which have good compatibility with the polyimide precursor and which are capable of providing a polymer having good heat resistance, and as a result, it has been found that acrylic or methacrylic monomers or oligomers which are commonly used as ultraviolet light curable adhesives are suitable.

Specifically, polyester acrylate, epoxy acrylate, urethane acrylate and silicone acrylate monomers or oligomers are useful as the acrylic or methacrylic monomer or oligomer. In particular, polyfunctional acrylate monomers or oligomers having an isocyanurate structure, for example, tris(acryloyloxyethyl) isocyanurate, isocyanuric acid EO (n=3)·ε-caprolactone modified triacrylate, and branched polyfunctional acrylate monomers or oligomers, for example, trimethylolpropane triacrylate, EO-modified trimethylolpropane triacrylate, pentaerythritol triacrylate, pentaerythritol tetraacrylate, and pentaerythritol hexaacrylate are useful. Further, methacrylic monomers or oligomers also can be similarly used, although a slight lowering in photosensitivity is observed. In particular, it has been found that when a lowering of the dielectric constant of the insulating film is intended, a blend of an acrylic or methacrylic fluoromonomer or fluorooligomer provides good results.

Further, the present inventors have found that inorganic polymer precursors used in ultraviolet light curable coating materials, especially phosphazenic monomers or oligomers and precursors (monomers or oligomers) of silicon-containing polymers also are suitable as the polymerizable monomer or oligomer.

The phosphazene compounds are known to be coating materials having good heat resistance (see Japanese Unexamined Patent Publication (Kokai) No. 63-241075). In the invention described in this publication, the phosphazene compounds are intended for use as coating materials for protecting the surface of decorative sheets, woods, plastics, paper, and clothes. For this reason, even if the phosphazene compound is used as a filler, the filler is limited to inorganic fillers and inorganic materials such as silica, and the disclosure does not concern itself with the use of the phosphazene compound in combination with an organic material. Further, unlike the present invention, the above-described publication does not disclose applications wherein the phosphazene compound is combined with a polyimide precursor for use as a photosensitive insulating film which is selectively patterned in the same manner as previously known photosensitive polyimides.

The phosphazenic monomer is preferably the following one wherein the chloro portion of the hexachlorocyclotriphosphazene [3PNC] is substituted with, for example, an acrylate group, a methacrylate group, a vinyl group, or an allyl group.

[3PNC]

Specific examples include the residues formed by removing a hydrogen atom from a hydroxyl group in methacrylates such as 2-hydroxyethyl methacrylate, 2-hydroxypropyl methacrylate and 2-hydroxymethyl methacrylate (a hydroxyalkyl methacrylate residue), and residues formed by removing a hydrogen atom from a hydroxyl group in acrylates such as 2-hydroxyethyl acrylate, 2-hydroxybutyl acrylate and 3-hydroxy-2-tert-butylpropyl acrylate (a hydroxyalkyl acrylate residue).

Residues formed by removing a hydrogen atom from a hydroxyl group in 2-hydroxyethyl methacrylate and by removing a hydrogen atom from a hydroxyl group in 2-hydroxyethyl acrylate are particularly preferred. When the above-described various hydroxyalkyl methacrylate residues are compared with the hydroxyalkyl acrylate residues, the hydroxyalkyl acrylate residues are considered better because the crosslinking rate is higher. Further, the use of these residues in the form of a mixture thereof with a polyfunctional acrylate or methacrylate monomer not containing any inorganic material is also possible.

Further, the present inventors have found that the following acrylic oligomers, which have been used as ultraviolet light curable adhesives, are also suitable as polymerizable oligomers.

It has been found that oligomers or oligoester acrylates having a methacryloyl group in a terminal or side chain are especially useful as the acrylic oligomer. Except for special cases, oligomers having an acryloyl group provide higher reactivity and sensitivity than oligomers having a methacryloyl group. More specifically, it has been found that trifunctional or higher functional acrylic oligomers having the following structure are particularly useful:

(I)

wherein

A is an acrylic acid, for example, acrylic acid or methacrylic acid;

B is a polyhydric alcohol, for example, 2-ethyl-2-hydroxymethyl-1,3-propanediol or pentaerythritol;

C is a polybasic acid, for example, 3-cyclohexene-1,2-dicarboxylic acid or 4-cyclohexene-1,2-dicarboxylic acid; and n denotes an integer having a value of one or more, and preferably 1 to 20.

The polymerization of the polymerizable monomers or oligomers as listed above is induced and proceeds in the presence of a polymerization initiator through the action of light, heat or the like. Specifically, when the polymerization initiator is irradiated with light or heat, radicals are generated from the polymerization initiator and such radicals induce the polymerization of the monomer or oligomer. The present inventors have made studies with a view to finding a polymerization initiator useful for the practice of the present invention, and as a result, have found that compounds well known to be capable of generating radicals through the action of light, for example, benzoin ether compounds, ketalin ether compounds, ketal compounds, acetophenone compounds, benzophenone compounds, thioxanthone compounds, organic peroxides, N-phenylglycine, triazine compounds and allene-iron complexes, are suitable. Typical examples of polymerization initiators are as follows, but it should be understood that the polymerization initiator is not limited to these compounds only.

Benzoin ether compounds:
  isopropyl benzoin ether, isobutyl benzoin ether, etc.
Ketal compounds:
  1-hydroxycyclohexyl phenyl ketone, benzyl dimethyl ketal, etc.
Acetophenone compounds:
  acetophenone, 2-hydroxy-2-methylpropiophenone, 4-isopropyl-2-hydroxy-2-methylpropiophenone, etc.
Benzophenone compounds:
  benzophenone, methyl o-benzoylbenzoate, etc.
Thioxanthone compounds:
  2-methylthioxanthone, 2-chlorothioxanthone, etc.
Organic peroxides:
  ketone peroxide, peroxy ketal, hydroperoxide, dialkyl peroxide, diacyl peroxide, peroxy ester, peroxy dicarbonate, etc.
Triazine compounds:
  Compounds having a 1,3,5-triazine structure and at least one trichloromethyl group in the molecule, such as 2,4,6-tris(trichloromethyl)-1,3,5-triazine and 2,4-bis(trichloromethyl)-6-phenyl-1,3,5-triazine.
Allene-iron complexes:
  ($\eta^6$-benzene) ($\eta^5$-cyclopentadienyl) iron (II) hexafluorophosphate, ($\eta^6$-pyrene) ($\eta^5$-cyclopentadienyl) iron (II) hexafluoroantimonate, ($\eta^6$-naphthalene) ($\eta^5$-cyclopentadienyl) iron (II) hexafluorophosphate, etc.

The above-described polymerization initiators may be used alone or in the form of a mixture thereof. Further, it is possible to enhance the sensitivity through exposure at an optimal wavelength.

The inventors have found that a composition which uses a polymerization initiator of dimeric imidazole compound exhibits a particularly high sensitivety and provides an excellent polymerized film. In a particularly preferred embodiment, the composition of the present invention therefore contains a dimeric imidazole compound as the polymerization initiator for a polymerizable monomer or oligomer.

Preferred dimeric imidazole compounds are exemplified by 2-(o-chlorophenyl)-4,5-bis(m-methoxyphenyl)-imidazole dimer, 2,2'-bis(o-chlorophenyl)-4,4',5,5'-tetraphenyl-1,2'-biimidazole, 1H-imidazole dimer, and 2,5-bis(o-chlorophenyl)-4-(3,4-dimethoxyphenyl)-dimer. Particularly preferred is 2,2'-bis(o-chlorophenyl)-4,4',5,5'-tetraphenyl-1,2'-biimidazole.

In the particularly preferred embodiment of a composition containing a dimeric imidazole compound, a useful polymerizable monomer or oligomer is an acrylic monomer or oligomer, or oligoester acrylate, which has an acryloyl or methacryloyl group preferably in its terminal or side chain. Except for special cases, a monomer or oligomer having an acryloyl group generally provides not only a higher reactivity but also a higher sensitivity than a monomer or oligomer having a methacryloyl group. More particularly, an acrylic oligomer having a tri- or more functionality is especially useful which has the above indicated structural formula (I).

As described before, the polymerization of the polymerizable monomers or oligomers is induced and proceeds in the presence of a polymerization initiator through the action of light, heat or the like. Specifically, when the polymerization initiator is irradiated with light or heat, radicals are generated from the polymerization initiator and such radicals induce the polymerization of the monomer or oligomer. The present inventors have made studies with a view to finding a polymerization initiator useful for the practice of the present invention, and as a result, have found that dimeric imidazole compounds referred to above provide a particularly superior sensitivity and a polymerized film when combined with a preferred acrylic monomer or oligomer.

Further, the use of the above-described polymerization initiators in combination with a sensitizer is recommended from the viewpoint of the effect. Examples of suitable sensitizers include di-n-butylamine, n-butylamine, triethylamine and triethylenetetramine and further ketocoumarin dyes, coumarin dyes, thioxanthene dyes, xanthene dyes and thiopyrylium salt dyes.

In the photosensitive, heat-resistant resin composition according to the present invention, the mixing proportions of the polyimide precursor, polymerizable monomer or oligomer and polymerization initiator may be widely varied depending upon factors such as desired results. The present inventors have found that the above-described acrylic monomer or oligomer in an amount of 10 to 500% by weight based on the polyimide precursor (weight of the polyimide precursor contained in the varnish) and the polymerization initiator in an amount of 0.1 to 50% by weight based on the monomer or oligomer are useful. Since the polymerizable monomer or oligomer is more inexpensive than the polyimide precursor, the cost of the resultant photosensitive, heat-resistant resin film or pattern per se formed therefrom drops with an increase in the amount of the monomer or oligomer in the composition. Further, the photosensitivity is increased with an increase in the amount of the monomer or oligomer and photopolymerization initiator in the composition.

The formation of the heat-resistant, insulating resin pattern according to the present invention starts with the coating of the photosensitive, heat-resistant resin composition on the base material to be treated. The coating is conducted by uniformly applying a resin composition in the form of a photosensitive liquid or the like onto the surface of a selected base material. The base material may be a ceramic substrate such as alumina ($Al_2O_3$) or a metallic substrate. Further the base material may be a semiconductor substrate (for example, a silicon substrate or a sapphire substrate) or the like in the case of use as a circuit substrate, a printed board or a wiring board for high-density mounting of components including multi-chip modules, and the substrate may be coated using a conventional coating process, such as spin coating, dip coating or doctor blade coating. The coating of the photosensitive, heat-resistant resin composition thus formed is prebaked at a properly elevated temperature so as to evaporate to some extent, the solvent contained therein (the varnish of the polyimide precursor usually contains 80% by weight or more of N-methyl-2-pyrrolidone as a solvent).

After the prebaking, the resultant coating is exposed to conditions capable of inducing polymerization of the polymerizable monomer or oligomer in a predetermined pattern (corresponding to the pattern of an intended heat-resistant, insulating resin film). Preferably, a pattern of light necessary for generating radicals from the simultaneously used polymerization initiator is applied to the coating, or a pattern of heat necessary for generating such radicals is applied to the coating. Specifically, a selective irradiation with light, such as ultraviolet light, is conducted through a mask. Consequently, only the polymerizable monomer or oligomer contained in the exposed portion (or heated portion) is selectively polymerized.

Then, in the coating, the regions other than those where a polymer has been formed from the monomer or oligomer are selectively removed. A development process wherein use is made of a developing solution comprising a solvent capable of dissolving the polyimide precursor and polymerizable monomer or oligomer can be advantageously employed for the above-described removal.

Subsequently, the remaining coating which has not been dissolved or removed during the development process is heat-treated to cause a cyclodehydration reaction of the polyimide precursor in the coating. The heat treatment temperature (heating temperature) in this step is not particularly limited as long as the polyimide precursor is converted into a polyimide without decomposition of the polymerizable monomer or oligomer. In general, however, the temperature is preferably about 250 to 350° C.

According to the process of the present invention, a pattern of a heat-resistant, insulating resin having satisfactory properties can be obtained at low cost through the above-described series of steps. Further, it is also advantageously possible to form an unpatterned photosensitive, heat-resistant resin film through the use of this process.

Figure 1:
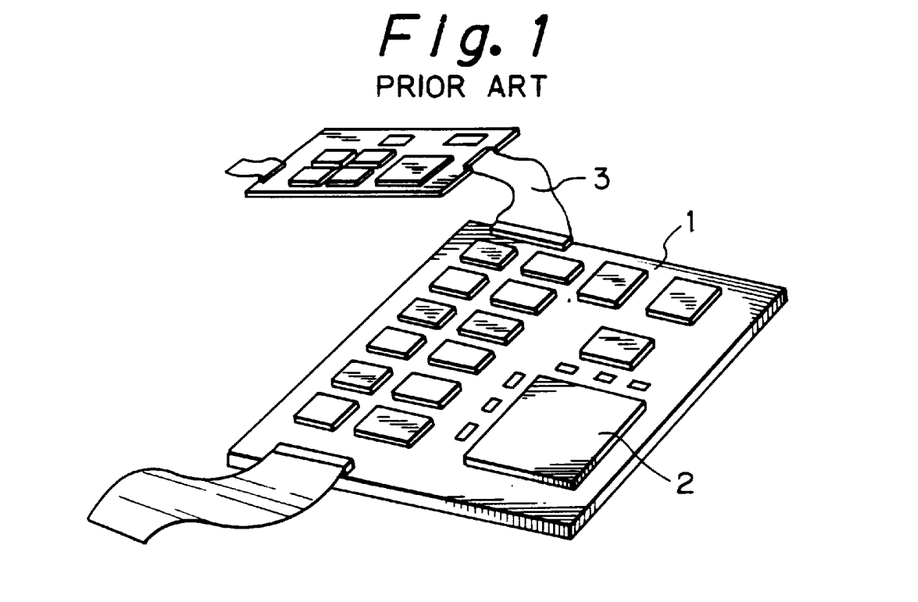
FIG. 1 is a perspective view showing one embodiment of a prior art multi-chip module to which the present invention is applicable.
Figure 2:
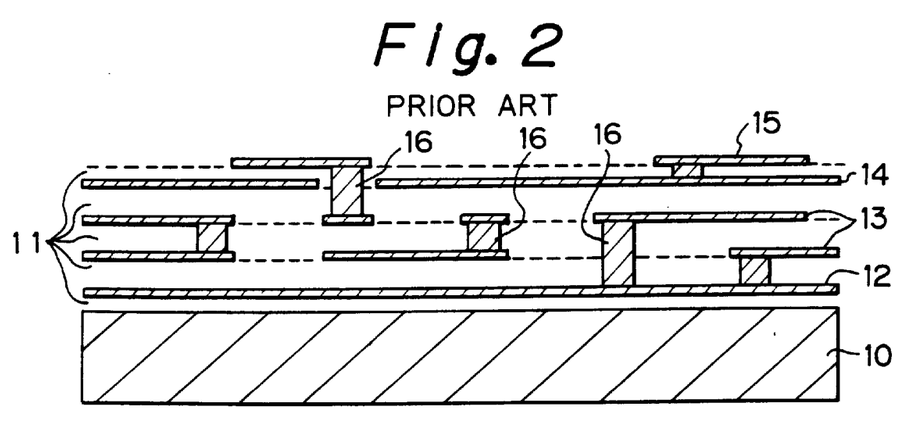
FIG. 2 is a cross-sectional view of the multi-chip module of FIG. 1.

As described above, the present invention can be advantageously used for the production of multi-chip modules. An embodiment of such a multi-chip module is shown in FIGS. 1 (appearance) and FIG. 2 (cross-section). Specifically, the multi-chip module shown in the drawings is provided with an LSI chip 2 mounted on a substrate 1 and further with a flexible printed board 3. As shown in FIG. 2, this multi-chip module has a layer structure such that, for example, layer-insulating films 11 of the present invention, a grounding layer 12, a signal layer 13, an electric power supply layer 14 and a surface electrode layer 15 are successively laminated onto a substrate 10, such as a silicon wafer or a ceramic substrate. Interlayer conductors 16 are formed in viaholes interconnecting the various conductive layers as shown.

Generally speaking, the multi-chip modules to which the present invention can be applied have a minimum size of approximately 5 cm×5 cm and include, for example, silicon (Si) wafers having a diameter of 3 in. or plates of glass, aluminum, copper or ceramic material, having a size of approximately 70 mm×70 mm. A pattern of an electrical conductor body such as aluminum or copper can be formed at various layer thicknesses and pattern widths. The conductor pattern can be formed, for example, by vapor depositing a conductor metal followed by selectively wet etching the deposited metal. A photolithographic process is preferably used in this wet etching. The interlayer insulator or layer-insulating film of the present invention, made of the described heat-resistant composition, can be applied at a film thickness of less than 40 $\mu$m.

In this connection, the pattern formation process of the present invention will be described with reference to FIGS. 3A to 3D and FIGS. 4A to 4C.

Figure 3A:
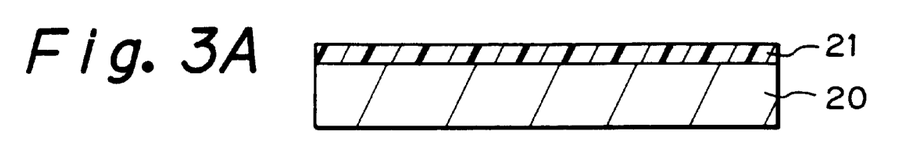
FIGS. 3A to 3D are cross-sectional views showing, in sequence, the pattern formation process of the present invention.
Figure 4A:
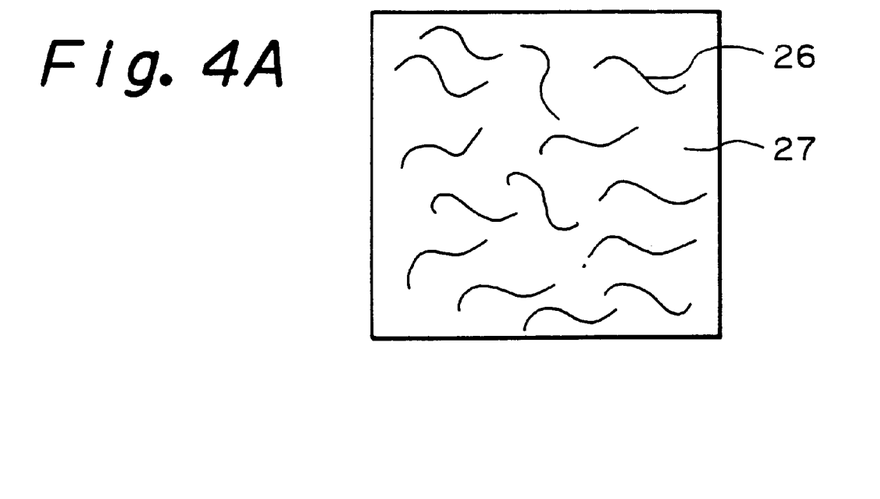
FIGS. 4A to 4C are schematic views showing, in sequence, the conversion of a polyimide precursor to a polyimide.

A photosensitive solution or resin composition of the present invention is spin-coated onto a Si wafer having a diameter of 3 in., and is then prebaked at 90° C. for 1 hr. As illustrated in FIG. 3A, a film 21 of the resin composition having a thickness of 5 $\mu$m is formed on the Si wafer 20. As shown in FIG. 4A, the film of the resin composition comprises the photopolymerizable monomer (or oligomer) 26 and polyimide precursor 27.

Figure 3B:
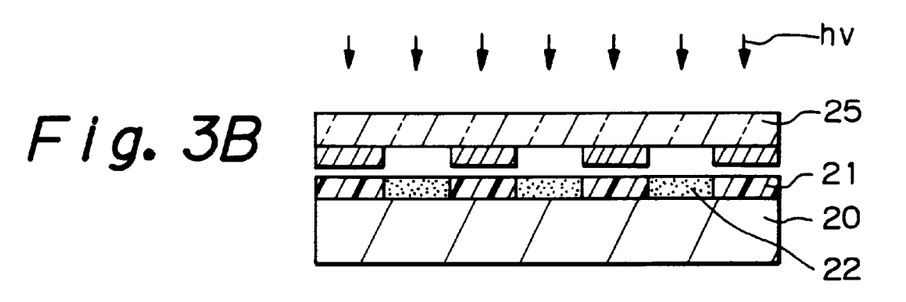
Figure 4B:
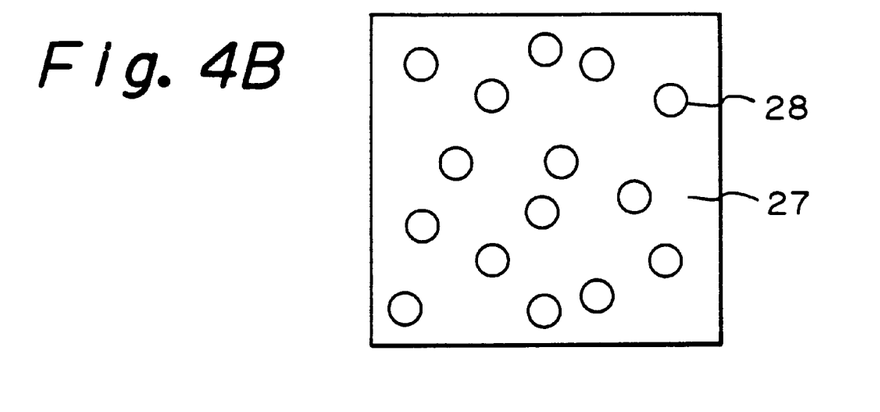

Next, as illustrated in FIG. 3B, a negative type glass mask 25 having a pattern width of 20 $\mu$m is disposed over the Si wafer 20, and the film 21 of the resin composition is exposed through the glass mask 25 to ultraviolet light having a wavelength of about 250 nm (or radiation having a wavelength of 250 to 400 nm from a Hg lamp) at an exposure level of 480 mJ/cm$^2$. As a result of this selective exposure, the unexposed areas of the film 21 remain unchanged, but the exposed areas 22 are changed because the photopolymerizable monomer is polymerized by the irradiation with ultraviolet light. Namely, as shown in FIG. 4B, the exposed areas 22 comprise polyimide precursor 27 and a polymerization product 28 of the monomer (or oligomer) in addition to unreacted monomer or oligomer (not shown).

Figure 3C:
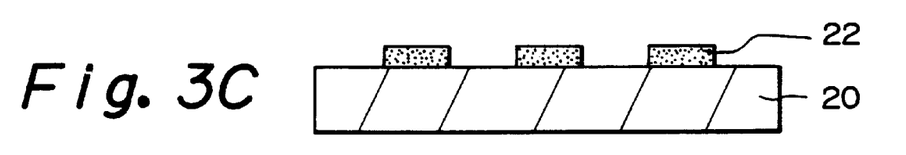

After selective exposure, the film 21 is developed with a solution of N-methyl-2-pyrrolidone using an ultrasonic development process. As illustrated in FIG. 3C, the exposed areas 22 remain on the wafer 20.

Figure 3D:
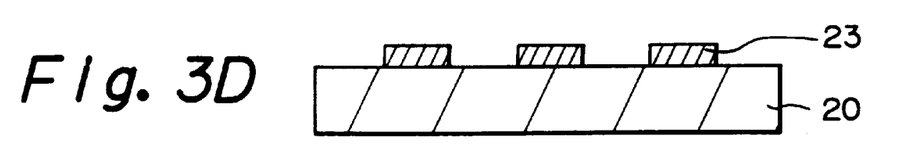
Figure 4C:
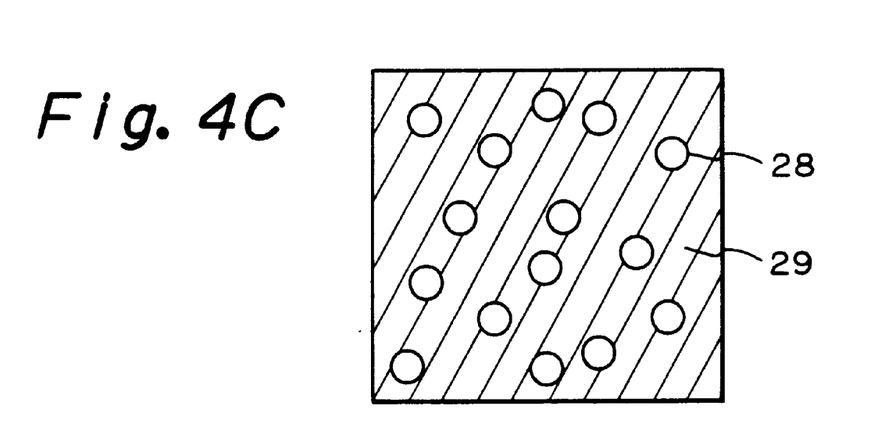

Finally, the wafer 20 is heated at 270° C. for 30 min (or at a suitable temperature of 250 to 350° C. for suitable time) to convert the polyimide precursor to polyimide. As illustrated in FIG. 3D, pattern 23 of the resulting polyimide resin is obtained on the wafer 20. The resulting polyimide resin is shown in FIG. 4C. Namely, the polyimide resin comprises the polymerization product 28 of the monomer (or oligomer) and polyimide 29. Note, FIGS. 4A to 4C are schematic views, and therefore the forms and proportions of the components 26, 27, 28 and 29 are illustrated to assist in the understanding of the conversion of polyimide precursor to polyimide resin.

It should be noted that FIG. 4C schematically clarifies the resulting polymerized film according to the invention, in which the polymerization product 28 formed by the polymerization reaction of a monomer or oligomer polymerizable by virtue of a polymerization initiator, is dispersed in a matrix of polyimide 29 formed by heating after the formation of the polymerized product 28. To attain this unique polymerized film, the polymerizable monomer or oligomer used in the invention is required to be capable of providing a high-heat-resistant polymer upon being polymerized so as to withstand a high temperature, such as 250 to 350° C., in the heat treatment for curing a polyimide precursor. The heat resistance of the polymer resulting from the polymerizable monomer or oligomer also provides the obtained film with a good heat resistance over a soldering temperature. The presence of the heat-resistant polymerization product 28 in the polyimide precursor before the heat treatment thereof effectively diminishes the reduction in film thickness during the heat treatment, as the polymerization product 28 is not lost through the heat treatment. In contrast, conventional polyimide-based compositions suffer from a considerable reduction of film thickness during a heat treatment because of the decomposition of photosensitive groups incorporated in a polyimide precursor and/or the loss of a substance in the composition, such as a polymerized material, by heating.

The conversion of polyimide precursor to polyimide resin is represented by the following reaction schema:

polyimide precursor polyimide

For a further understanding of the present invention, the photosensitive, heat-resistant resin composition according to the present invention and the formation of a pattern using the same will now be described by way of the following Examples.

EXAMPLE 1

In this Example, the use of various polyimide precursors is described.

| | |
|---|---|
| Varnish of polyimide precursor: (precursor content of varnish: 14.5% by weight) | 50.0 g; |
| Photopolymerizable monomer: [tris (acryloyloxyethyl) isocyanurate] | 10.0 g; |
| Photopolymerization initiator: benzophenone | 1.0 g. |

Varnishes of a polyimide precursor and of a polybismaleimide precursor, each having a precursor content of 14.5% by weight, were prepared, and the precursors were compared using the same monomer and photopolymerization initiator.

A photosensitive solution having the above-described composition was spin-coated onto a pretreated Si wafer having a diameter of 3 in., and the coated wafer was then prebaked at 90° C. for 1 hr. The thickness of the film after prebaking was 5 μm.

A negative type glass mask having a minimum pattern width of 30 μm was placed on the photosensitive plate and the coated and masked plate was irradiated with ultraviolet light having a wavelength of 250 nm under exposure conditions of 480 mJ/cm$^2$.

Then, the photosensitive plate was subjected to ultrasonic wave development using N-methyl-2-pyrrolidone, and was then rinsed in ethyl alcohol, thereby developing the plate. The unexposed regions were eluted or dissolved while leaving the exposed pattern regions only on the wafer.

The plate was then heated at 270° C. for 30 min to convert the residual polyimide precursor into a polyimide resin. As a result, although the yellow coloration of the pattern region increased slightly, no other changes were observed.

The pattern was observed under a microscope, and no breakage was found in any sample. The thermal decomposition temperature of the resin in the pattern region was measured, and it was found that the resins were stable up to about 350° C., regardless of the type of varnish used as the precursor.

EXAMPLE 2

In this Example, the use of various photopolymerizable monomers is described.

An experiment was conducted in the same manner as that of Example 1, except that varnishes of the polyimide precursor and the photopolymerization initiator as described in Example 1 were used with four different photopolymerizable monomers as given below, and the photosensitive plates were irradiated with ultraviolet light having a wavelength of 250 nm under suitable exposure conditions.

The photopolymerizable monomers are listed and the exposure and thermal decomposition temperatures are given in Table 1. The identities and amounts of addition of the photopolymerizable monomers are referred to by Nos. 1 to 5 below (No. 1 is the same material as that used in Example 1).

No. 1: tris(acryloyloxyethyl) isocyanurate (amount of addition: 10 g)

No. 2: glycidyl acrylate (amount of addition: 5 g)

No. 3: pentaerythritol triacrylate (amount of addition: 20 g)

No. 4: dipentaerythritol hexaacrylate (amount of addition: 15 g)

No. 5: mixture of tris(acryloyloxyethyl) isocyanurate (amount of addition: 6 g) with trimethylolpropane triacrylate (amount of addition: 4 g)

The patterns were observed under a microscope, and no breakage was found in any sample. The thermal decomposition temperatures of the resins in the pattern regions were measured, and as a result, the heat resistance was determined to be 280 to 400° C. in terms of the thermal decomposition temperature.

TABLE 1

| Photopolymerizable monomer | Exposure (mJ/cm²) | Decomposition temp. (° C.) |
|---|---|---|
| No. 1 | 480 | 350 |
| No. 2 | 960 | 400 |
| No. 3 | 400 | 280 |
| No. 4 | 640 | 300 |
| No. 5 | 560 | 320 |

EXAMPLE 3

In this Example, various photopolymerization initiators are examined.

An experiment was conducted in the same manner as that of Example 1, except that varnishes of the polyimide precursor and the photopolymerizable initiator as described in Example 1 were used with six different photopolymerization initiators as given below and the photosensitive plates were irradiated with ultraviolet light having a wavelength of 250 nm under suitable exposure conditions.

The photopolymerization initiators are listed and the exposure conditions necessary for the formation of a pattern are given in Table 2. The identities and amounts of addition of the photopolymerization initiators are referred to by Nos. 1 to 6 below (No. 1 is benzophenone, i.e., the same material as that used in Example 1).

No. 1: benzophenone (amount of addition: 1.0 g)

No. 2: 3,3'-4,4'-tetra-(tert-butylperoxycarbonyl) benzophenone (amount of addition: 0.80 g)

No. 3: isopropyl benzoin ether (amount of addition: 2.0 g)

No. 4: 2-hydroxy-methyl-propiophenone (amount of addition: 0.50 g)

No. 5: 2-methylthioxanthone (amount of addition: 0.20 g)

No. 6: 2,4-bis(trichloromethyl)-6-phenyl-1,3,5-triazine (amount of addition: 1.50 g)

The patterns were observed under a microscope, and no breakage was found in any sample.

The following results were obtained when the development was conducted under the same developing conditions as described above in Example 1, and the results are not equal to the sensitivities of the respective photopolymerization initiators. Therefore, it has been found that the sensitivity of the composition varies with the amount of the photopolymerization initiator therein and with the developing conditions.

TABLE 2

| Photopolymerization initiator | Exposure (mJ/cm²) |
|---|---|
| No. 1 | 480 |
| No. 2 | 400 |
| No. 3 | 400 |
| No. 4 | 800 |
| No. 5 | 1,280 |
| No. 6 | 560 |

EXAMPLE 4

In this Example, the use of a modified polyimide precursor is described.

| | |
|---|---|
| Varnish of polyimide precursor: silicone-modified polyimide (precursor content of varnish: 13.5% by weight) | 50.0 g; |
| Photopolymerizable monomer: pentaerythritol tetraacrylate | 12.0 g; |
| Photopolymerization initiator: benzoyl peroxide | 2.0 g. |

A photosensitive solution having the above-described composition was spin-coated onto a pretreated Si wafer having a diameter of 3 in., and the coated wafer was prebaked at 120° C. for 1 hr. The thickness of the film after prebaking was 6 μm.

A negative type glass mask having a minimum pattern width of 30 μm was placed on the photosensitive plate and the coated and masked wafer was irradiated with light from a high-pressure mercury lamp for 20 sec.

Then, the photosensitive plate was subjected to ultrasonic wave development using a mixed solution comprising N-methyl-2-pyrrolidone and methyl cellosolve, and thereafter the plate was rinsed in isopropyl alcohol, thereby developing the plate. The unexposed regions were eluted while the exposed pattern regions only were left on the plate.

The plate was then heated at 300° C. for 30 min to convert the residual polyimide precursor into a polyimide resin, and as a result, although the yellow coloration of the pattern region was increased slightly, no other changes were observed.

The pattern was observed under a microscope, and no breakage was found in any sample. The thermal decomposition temperature of the resin in the pattern region was measured, and it was found that the resin was stable up to about 300° C.

EXAMPLE 5

| | |
|---|---|
| Varnish of polyimide precursor: polyimide precursor (14.5% by weight) | 50.0 g; |
| Phosphazene monomer: HEMA6-substituted 3PNC (3PNC in which each of six (6) Chlorine substituents is substituted with 2-hydroxyethyl methacrylate) | 10.0 g; |
| Photopolymerization initiator: 2,2-dimethoxy-2-phenylacetophenone | 1.00 g; |
| Solvent: methyl ethyl ketone | 10.0 g. |

A photosensitive solution having the above-described composition was spin-coated onto a pretreated Si wafer having a diameter of 3 in., and the coated wafer was prebaked at 90° C. for 1 hr. The thickness of the film after prebaking was 3 μm.

A negative type glass mask having a minimum pattern width of 30 μm was placed on the photosensitive plate and the coated and masked plate was irradiated with an ultraviolet light from a high-pressure mercury lamp (wavelength: 250–400 nm) at exposure conditions of 500 mJ/cm² (in terms of a wavelength of 365 nm).

Then, the photosensitive plate was subjected to ultrasonic wave development using N-methyl-2-pyrrolidone, and then the plate was rinsed in ethyl alcohol, thereby developing the plate. The unexposed regions were eluted while the exposed pattern regions only were left on the plate.

The pattern regions were then heated at 260° C. for 30 min to convert the residual polyimide precursor into a polyimide resin, and as a result, although the yellow coloration of the pattern region increased slightly, no other changes were observed.

The pattern was observed under a microscope, and no breakage was found. The thermal decomposition temperature of the resin in the pattern regions was measured, and the resin was found to be stable up to about 350° C.

EXAMPLE 6 TO 8

Patterns were formed in the manner described above in Example 5, except that HEA6-substituted 3PNC (3PNC in which each of six Cl substituents is substituted with 2-hydroxyethyl acrylate), a mixture of HEMA6-substituted 3PNC with trimethylolpropane triacrylate or a mixture of HEMA6-substituted 3PNC with pentaerythritol triacrylate and isocyanuric acid EO-modified (n=3) triacrylate was used instead of the HEMA6-substituted 3PNC used in Example 5. The appearance of the patterns were observed under a microscope, and no abnormal portions were found. The thermal decomposition temperature of the resin in each pattern region was measured. The results are given in the following Table 3.

TABLE 3

| Ex. No. | Monomer | Exposure (mJ/cm²) | Thermal decomposition temp. (° C.) |
|---|---|---|---|
| 5 | HEMA6-substituted 3PNC (10.0 g) | 500 | 350 |
| 6 | HEA6-substituted 3PNC (6.0 g) | 750 | 400 |
| 7 | HEMA6-substituted 3PNC (8.0 g) + trimethylolpropane triacrylate (4.0 g) | 350 | 330 |
| 8 | HEMA6-substitued 3PNC (5.0 g) + pentaerythritol triacrylate (5.0 g) + isocyanuric acid EO-modified (n = 3) triacrylate (5.0 g) | 400 | 360 |

EXAMPLE 9 TO 13

Exposure conditions suitable for the formation of patterns were examined in the same manner as described above in Example 5, except that 3,3'-4,4'-tetra-(tert-butylperoxycarbonyl) benzophenone, isopropyl benzoin ether, 2-hydroxy-2-methyl-propiophenone, 2-methylthioxanthone or 2,4-bis(trichloromethyl)-6-phenyl-1,3,5-triazine was used as the initiator instead of 2,2-dimethoxy-2-phenylacetophenone. The results are given in Table 4. These results were obtained by conducting the development using the same developing conditions as described above in Example 5 and the results are not completely equal to the sensitivities of the respective photopolymerization initiators. It also has been found that the sensitivity of the composition varies with the amount of the photopolymerization initiator therein and with the developing conditions.

TABLE 4

| Ex. No. | Photopolymerization initiator | Exposure (mJ/cm²) |
|---|---|---|
| 5 | 2,2-dimethoxy-2-phenylacetophenone (1.00 g) | 500 |
| 9 | 3,3'-4,4'-tetra-(tert-butylperoxycarbonyl) benzophenone (0.80 g) | 250 |
| 10 | isopropyl benzoin ether (2.00 g) | 400 |
| 11 | 2-hydroxy-2-methyl-propiophenone (0.50 g) | 800 |
| 12 | 2-methylthioxanthone (0.20 g) | 1,000 |
| 13 | 2,4-bis(trichloromethyl)-6-phenyl-1,3,5-trizaine (1.50 g) | 350 |

EXAMPLE 14

| | |
|---|---|
| Varnish of silicone-modified polyimide precursor: silicone-modified polyimide precursor (13.5% by weight) | 50.0 g; |
| Phosphazene monomer: HEA6-substituted 3PNC (3PNC in which each of six Cl substituents is substituted with 2-hydroxyethyl acrylate) | 12.0 g; |
| Photopolymerization initiator: benzoyl peroxide | 2.00 g. |

A photosensitive solution having the above-described composition was spin-coated onto a glass substrate having a size of 70×70×1 mm, and the coated substrate was prebaked at 120° C. for 1 hr. The thickness of the film after prebaking was 5 μm.

A negative type glass mask having a minimum pattern width of 30 μm was placed on the photosensitive plate and the coated and masked plate was irradiated with light from a high-pressure mercury lamp for 60 sec.

Then, the photosensitive plate was subjected to ultrasonic wave development using a mixed solution comprising N-methyl-2-pyrrolidone and methyl cellosolve and then the plate was rinsed in isopropyl alcohol, thereby developing the plate. The unexposed regions were eluted while the exposed pattern regions only were left on the plate.

The pattern regions were then heated at 250° C. for 50 min to convert the residual polyimide precursor into a polyimide resin, and as a result, although the yellow coloration of the pattern region increased slightly, no other changes were observed.

The pattern was observed under a microscope, and no breakage was found. The thermal decomposition temperature of the resin in the pattern region was measured, and as a result, the resin was found to be stable up to about 300° C.

EXAMPLE 15

| | |
|---|---|
| Varnish of polyimide precursor: polyimide precursor (14.5% by weight) | 50.0 g; |
| Acrylic oligomer: oligomer 1 represented by the following formula | 10.0 g, | wherein
A: acrylic acid

-continued

B: 2-ethyl-2-hydroxymethyl-1,3-propanediol
C: 3-cyclohexene-1,2-dicarboxylic acid
  : 4-cyclohexene-1,2-dicarboxylic acid;
Photopolymerization initiator: 2,2-dimethoxy-2-    1.00 g
phenylacetophenone.

A photosensitive solution having the above-described composition was spin-coated onto a silicon wafer having a diameter of 3 in., and the coated wafer was prebaked at 120° C. for 1 hr. The thickness of the film after the prebaking was 9 μm.

A negative type glass mask having a minimum pattern width of 30 μm was placed on the photosensitive plate and the coated and masked plate was irradiated with ultraviolet light by means of an ultraviolet exposing machine at an exposure of 600 mJ/cm² (365 nm).

The photosensitive plate was subjected to ultrasonic wave development with N-methyl-2-pyrrolidone and then the plate was rinsed in ethyl alcohol, thereby developing the plate. The unexposed regions were eluted while the exposed pattern regions only were left on the plate.

The pattern regions were then heated at 300° C. for 30 min to convert the residual polyimide precursor into a polyimide resin. As a result, although the yellow coloration of the pattern region increased slightly, no other changes were observed.

The pattern was observed under a microscope, and no breakage was found. The thermal decomposition temperature of the resin in the pattern region was measured, and as a result, the resin was found to be stable up to about 350° C.

EXAMPLE 16 TO 20

Patterns were formed in the same manner as described above in Example 15, except that the following oligomer 2, oligomer 3, mixture of oligomer 1 with pentaerythritol triacrylate, mixture of oligomer 2 with trimethylolpropane triacrylate and mixture of oligomer 3 with isocyanuric acid EO-modified (n=3) triacrylate were used instead of the acrylic oligomer 1 used in Example 15. The various patterns were observed under a microscope, and no breakage was found. The thermal decomposition temperatures of the resins in the pattern region were measured. The results are given in Table 5. Oigomers 2 and 3 are as follows:

Acrylic oligomer 2:

wherein
A: methacrylic acid
B: 2-ethyl-2-hydroxymethyl-1,3-propanediol
C: 4-cyclohexene-1,2-dicarboxylic acid.
Acrylic oligomer 3:

wherein
A: acrylic acid
B: 2-ethyl-2-hydroxymethyl-1,3-propanediol

: pentaerythritol
C: 3-cyclohexene-1,2-dicarboxylic acid
  : 4-cyclohexene-1,2-dicarboxylic acid.

TABLE 5

| Ex. No. | Oligomer | Exposure (mJ/cm²) | Thermal decomposition temp. (° C.) |
|---|---|---|---|
| 15 | oligomer 1 (10.0 g) | 600 | 350 |
| 16 | oligomer 2 (5.0 g) | 960 | 400 |
| 17 | oligomer 3 (15.0 g) | 600 | 330 |
| 18 | oligomer 1 (6.0 g) + pentaerythritol triacrylate (6.0 g) | 720 | 300 |
| 19 | oligomer 2 (6.0 g) + trimethylolpropane triacrylate (4.0 g) | 840 | 360 |
| 20 | oligomer 3 (5.0 g) + isocyanuric acid EO-modified (n = 3) triacrylate (8.0 g) | 800 | 340 |

EXAMPLE 21 TO 29

Exposure conditions necessary for the formation of patterns were determined in the same manner as described in Example 15, except that 3,3'-4,4'-tetra-(tert-butylperoxycarbonyl) benzophenone, isobutyl benzoin ether, benzyl methyl ketal, 2-methylthioxanthone, 2,4,6-tris (trichloromethyl)-1,3,5-triazine, benzoyl peroxide, 2,4-bis (trichloromethyl)-6-phenyl-1,3,5-trizaine, ($\eta^6$ -benzene) ($\eta^5$-cyclopentadienyl) (II) hexafluorophosphate and N-phenylglycine were used as the initiator instead of 2,2-dimethoxy-2-phenylacetophenone as was used in Example 15. The results are given in Table 6. These results were obtained by conducting the development using the same developing conditions as were used in Example 15 and the results are not completely equal to the sensitivities of the respective photopolymerization initiators. It also has been found that the sensitivity of the composition varies with the amount of the photopolymerization initiator therein and the developing conditions.

TABLE 6

| Ex. No. | Photopolymerization initiator | Exposure (mJ/cm²) |
|---|---|---|
| 15 | 2,2-dimethoxy-2-phenylacetophenone (1.00 g) | 600 |
| 21 | 3,3'-4,4'-tetra-(tert-butylperoxy-carbonyl) benzophenone (0.80 g) | 540 |
| 22 | isopropyl benzoin ether (2.00 g) | 840 |
| 23 | benzyl dimethyl ketal (0.50 g) | 960 |
| 24 | 2-methylthioxanthone (0.20 g) | 1,200 |
| 25 | 2,4,6-tris(trichloromethyl)-1,3,5-triazine (1.50 g) | 720 |
| 26 | benzoyl peroxide (1.50 g) | 840 |
| 27 | 2,4-bis(trichloromethyl)-6-phenyl-1,3,5-triazine (0.50 g) | 1,200 |
| 28 | ($\eta^6$-benzene) ($\eta^5$-cyclopentadienyl) (II) hexafluorophosphate (2.00 g) | 720 |
| 29 | N-phenylglycine (1.80 g) | 840 |

EXAMPLE 30

| | |
|---|---|
| Varnish of silicone-modified polyimide presursor: silicone-modified polyimide precursor (13.5% by weight) | 50.0 g; |
| Acrylic oligomer: oligomer 1 | 5.0 g; |
| Monomer: isocyanuric acid EO (n = 3) · ε – caprolactone modified triacrylate | 5.0 g; |
| Photopolymerization initiator: 2-hydroxy-2-methyl-propiophenone | 1.50 g. |

A photosensitive solution having the above-described composition was spin-coated onto a pretreated Si wafer having a diameter of 3 in., and the coated wafer was prebaked at 100° C. for 1 hr. The thickness of the film after prebaking was 8 μm.

A negative type glass mask having a minimum pattern width of 30 μm was placed on the photosensitive plate and the coated and masked plate was irradiated with light from a high-pressure mercury lamp for 40 sec.

Then, the photosensitive plate was subjected to ultrasonic wave development using a mixed solution comprising N-methyl-2-pyrrolidone and methyl cellosolve and the plate was then rinsed in isopropyl alcohol, thereby developing the plate. The unexposed regions were eluted while the exposed pattern regions only were left on the plate.

The pattern regions were then heated at 280° C. for 30 min to convert the residual polyimide precursor into a polyimide resin. As a result, although the yellow coloration of the pattern region increased slightly, no other changes were observed.

The pattern was observed under a microscope, and no breakage was found. The thermal decomposition temperature of the resin in the pattern regions was measured, and as a result, the resin was found to be stable up to about 330° C.

EXAMPLE 31

Viaholes were formed using a photosensitive solution having the same composition as that of Example 30 and using the same procedure as in Example 30, except that a pretreated ceramic substrate ($Al_2O_3$) having a bell size, a pretreated glass substrate having a size of 70×70×1 mm, a pretreated aluminum plate having a size of 70×70×2 mm and a pretreated copper plate having a size of 70×70×1 mm were used instead of the 3 in. diameter Si wafer. Use was made of a negative type glass mask having a minimum viahole size of 50 μmφ. By observation under a microscope after curing, it has been found that via-holes having a size up to 50 μmφ were formed.

EXAMPLE 32

A resin composition containing a dimeric imidazole compound initiator was prepared which had the following composition:

| | |
|---|---|
| Varnish of polyimide precursor: polyimide precursor (17.5% by weight) | 50.0 g; |
| Acrylic oligomer: oligomer 4 represented by the following formula | 10.0 g; |

-continued

| | |
|---|---|
| wherein A: acrylic acid B: 2-ethyl-2-hydroxymethyl-1,3-propanediol C: 3-cyclohexene-1,2-dicarboxylic acid : 4-cyclohexene-1,2-dicarboxylic acid; Photopolymerization initiator: 2,2'-bis(o-chlorophenyl)-4,4',5,5'-tetraphenyl-1,2'-diimidazole. | 1.00 g |

A photosensitive solution having the above-described composition was spin-coated onto a silicon wafer having a diameter of 3 in., and the coated wafer was prebaked at 120° C. for 1 hour. The thickness of the film after the prebaking was 20 μm.

A negative type glass mask having a minimum pattern width of 30 μm was placed over the photosensitive plate and the coated and masked plate was irradiated with ultraviolet light by means of an ultraviolet exposing machine at an exposure of 250 mJ/cm² (365 nm).

The photosensitive plate was subjected to ultrasonic wave development with N-methyl-2-pyrrolidone and then the plate was rinsed in ethyl alcohol, thereby developing the plate. The unexposed regions were eluted while the exposed pattern regions only were left on the plate.

The pattern regions were then heated at 300° C. for 30 min. to convert the residual polyimide precursor into a polyimide resin. As a result, although the yellow coloration of the pattern region increased slightly, no other changes were observed.

The pattern was observed under a microscope, and no breakage was found. The thermal decomposition temperature of the resin in the pattern region was measured, and as a result, the resin was found to be stable up to about 350° C.

EXAMPLE 33 TO 37

Patterns were formed in the same manner as described in Example 32, except that the following oligomer 5, oligomer 6, mixture of oligomer 5 with trimethylolpropane triacrylate, isocyanuric acid EO-modified (n=3) triacrylate, and pentaerythritol triacrylate were used instead of the acrylic oligomer 4 used in the above-described Example 32. The various patterns were observed under a microscope, and no breakage was found. The thermal decomposition temperatures of the resins in the pattern region were measured. The results are given in Table 7. Oigomers 5 and 6 are as follows:

Acrylic oligomer 5:

wherein
A: methacrylic acid
B: 2-ethyl-2-hydroxymethyl-1,3-propanediol
C: 4-cyclohexene-1,2-dicarboxylic acid.

Acrylic oligomer 6:

wherein

-continued

A: acrylic acid
B: 2-ethyl-2-hydroxymethyl-1,3-propanediol
  : pentaerythritol
C: 3-cyclohexene-1,2-dicarboxylic acid
  : 4-cyclohexene-1,2-dicarboxylic acid.

TABLE 7

| Ex. No. | Oligomer | Exposure (mJ/cm²) | Thermal decomposition temp. (° C.) |
|---|---|---|---|
| 32 | oligomer 4 (10.0 g) | 250 | 350 |
| 33 | oligomer 5 (9.0 g) | 360 | 400 |
| 34 | oligomer 6 (15.0 g) | 300 | 330 |
| 35 | oligomer 5 (6.0 g) + trimethylolpropane triacrylate (6.0 g) | 420 | 300 |
| 36 | isocyanuric acid EO-modified (n = 3) triacrylate (10.0 g) | 340 | 360 |
| 37 | pentaerythritol triacrylate (10.0 g) | 400 | 340 |

EXAMPLE 38

A resin composition containing a dimeric imidazole compound initiator was prepared which had the following composition:

| | |
|---|---|
| Varnish of polyimide precursor: polyimide precursor (14.5% by weight) | 50.0 g; |
| Acrylic oligomer: oligomer 4 represented by the following formula | 10.0 g; | wherein
A: acrylic acid
B: 2-ethyl-2-hydroxymethyl-1,3-propanediol
C: 3-cyclohexene-1,2-dicarboxylic acid
  : 4-cyclohexene-1,2-dicarboxylic acid

| | |
|---|---|
| Photopolymerization initiator: 2,2'-bis(o-chlorophenyl)-4,4',5,5'-tetraphenyl-1,2'-diimidazole. | 1.00 g |

A photosensitive solution having the above-described composition was spin-coated onto a silicon wafer having a diameter of 3 in., and the coated wafer was prebaked at 115° C. for 1 hour. The thickness of the film after the prebaking was 16 μm.

A negative type glass mask having a minimum pattern width of 30 μm was provided over the photosensitive plate and the coated and masked plate was irradiated with ultraviolet light by means of an ultraviolet exposing machine at various exposures of 30 to 360 mJ/cm² (365 nm).

The photosensitive plate was subjected to ultrasonic wave development with N-methyl-2-pyrrolidone for 40 seconds, and then the plate was rinsed in ethyl alcohol, thereby developing the plate. The unexposed regions were eluted while the exposed pattern regions only were left on the plate.

The pattern regions were then heated at 300° C. for 30 min. to convert the residual polyimide precursor into a polyimide resin.

The film thickness before and after the curing of the polyimide precursor and the surface roughness of the film after the curing were measured. The results are plotted against the exposure in FIG. 5.

EXAMPLE 39

Using a similar procedure to that in the above Example 38, the film thickness before and after the curing of the polyimide precursor and the surface roughness of the film after the curing were measured, but in this Example, the photopolymerization initiator was replaced by 2,2'-dimethoxy-2-phenylacetophenone. The results are plotted against the exposure in FIG. 6.

Figure 5:
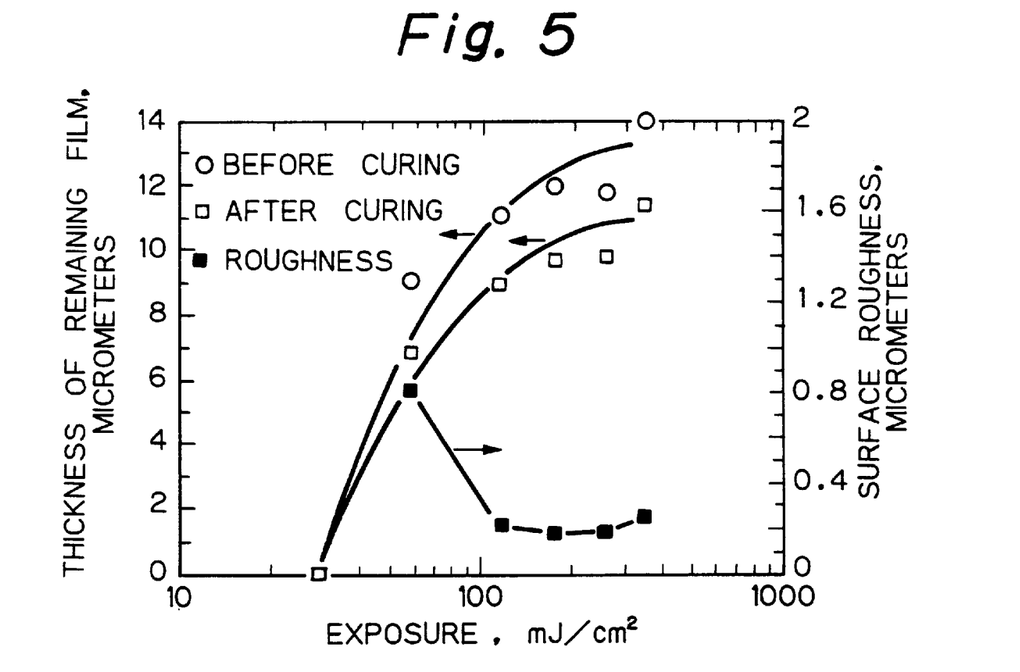
FIGS. 5 and 6 show the relationships between the exposure and the thickness and surface roughness of the resultant film in Examples 38 and 39, respectively.
Figure 6:
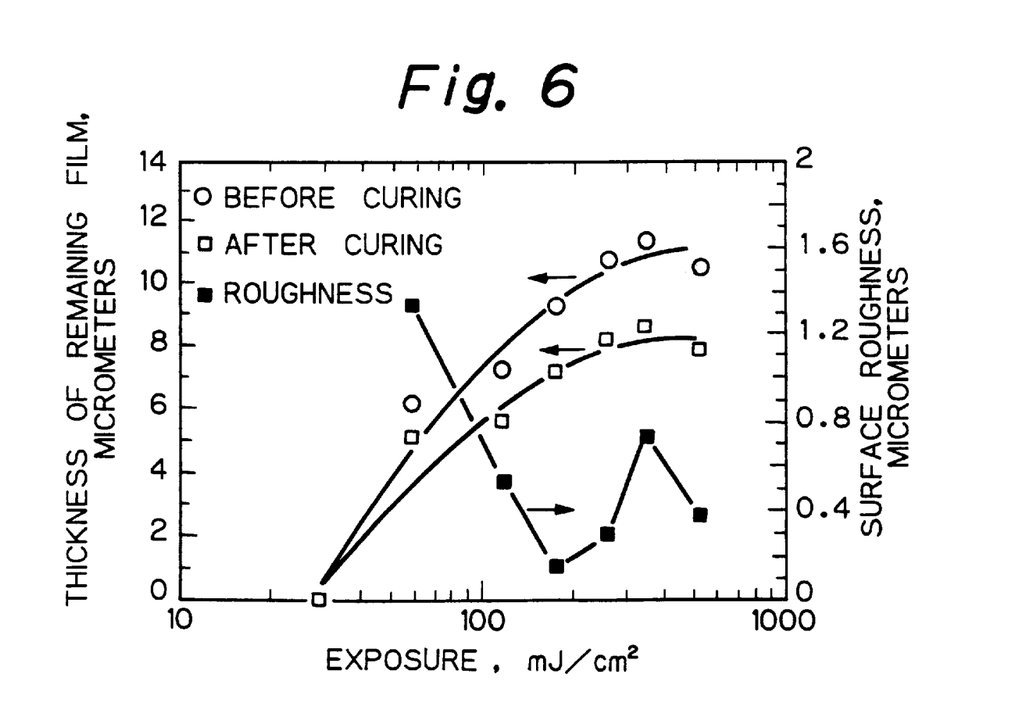

Referring to FIGS. 5 and 6, the thicker the remaining film is at the same exposure, the higher the film sensitivity. The comparison between FIGS. 5 and 6 reveals that the composition containing the dimeric imidazole compound initiator of Example 38 is superior in sensitivity to the composition of Example 38 containing the initiator other than the dimeric imidazole compound. On the other hand, the film after curing of the composition containing the dimeric imidazole compound initiator had a distinctly reduced surface roughness compared with the film resulting from the composition containing the initiator other than the dimeric imidazole compound. Scanning electron microscopy indicated that the greater the surface roughness, the worse the film quality.

EXAMPLE 40

A similar procedure to that in Example 32 was used to form a patterned film, except that the varnish of polyimide precursor was replaced with a varnish of silicone-modified polyimide precursor (13.5% by weight content of precursor in the varnish). The resultant patterned film was observed under a microscope, and no breakage was found in any sample. A test of decomposition of the resultant film revealed that the film was stable up to about 365° C.

As can be appreciated from the above description, a photosensitive, heat-resistant resin can be provided at a low cost through the practice of the present invention. This resin has heat resistance characteristics sufficient for being used as layer insulating films, surface protective films or the like for circuit substrates, printed boards and wiring boards for high-density mounting including multi-chip modules or the like. In addition, the resin of the invention is resistant to temperatures that are greater than soldering temperatures. Further, as opposed to conventional materials and processes, the composition of the invention eliminates the reduction in the film thickness caused by decomposition of the photosensitive groups, which makes it possible to form patterns having a high dimensional accuracy.

Further, according to the present invention, it is possible to provide a useful heat-resistant insulating film which is superior to conventional insulating films in adhesion to a base material and which has a good moisture resistance, excellent properties of the sort that are inherent in the inorganic high-molecular materials, such as phosphazene compounds, including hardness, abrasion resistance and chemical resistance, photosensitivity, heat resistance above the soldering temperature and considerably lower cost than polyimide resins generally. Other effects of the present invention can be easily understood from the above detailed description of the invention.

We claim:

1. A polyimide resin composition, consisting of:
   a non-photosensitive polyimide precursor varnish which undergoes a cyclodehydration reaction to form a polyimide;
   a photopolymerizable acrylic or methacrylic oligomer or monomer compatible with said non-photosensitive polyimide precursor, and which undergoes photopolymerization to provide a high-heat-resistant polymer; and a polymerization initiator for said oligomer or monomer, wherein said composition is used in a polymerization process in which said oligomer or monomer is selectively photopolymerized to provide a photopolymerization product of the oligomer or monomer, which product includes a residual amount of said non-photosensitive polyimide precursor, and simultaneously or subsequently the composition is heated to cause the cyclodehydration reaction to occur to cure the residual non-photosensitive polyimide precursor by converting same into the polyimide, wherein said polymerization initiator is 2,2'-bis(o-chlorophenyl)-4,4',5,5'-tetraphenyl-1,2'-biimidazole, wherein said oligomer or monomer is represented by the following formula:

wherein

A is an acrylic or methacrylic acid;

B is a polyhydric alcohol;

C is a polybasic acid; and n denotes an integer having a value of one or more, and wherein the photopolymerized oligomer or monomer is contained in the polyimide resin composition.

2. The composition as recited in claim 1, wherein said polyimide is a precursor of a modified polyimide.

* * * * *